(12) United States Patent
Yoshimoto

(10) Patent No.: US 6,877,120 B2
(45) Date of Patent: Apr. 5, 2005

(54) METHOD OF ACQUIRING SCAN CHAIN REORDER INFORMATION, AND COMPUTER PRODUCT

(75) Inventor: Tokumei Yoshimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 576 days.

(21) Appl. No.: 10/101,271

(22) Filed: Mar. 20, 2002

(65) Prior Publication Data

US 2003/0037296 A1 Feb. 20, 2003

(30) Foreign Application Priority Data

Aug. 8, 2001 (JP) ........................................ 2001-241374

(51) Int. Cl.[7] ............................ G01R 31/28; G06F 9/45
(52) U.S. Cl. ............................... 714/726; 716/7; 716/12
(58) Field of Search ................................. 714/726, 729, 714/727, 741, 32, 33, 30, 734; 716/1, 4, 7, 12

(56) References Cited

U.S. PATENT DOCUMENTS 5,748,497 A * 5/1998 Scott et al. ................. 702/181
6,256,770 B1 * 7/2001 Pierce et al. ................. 716/18
6,405,355 B1 * 6/2002 Duggirala et al. ............. 716/8

FOREIGN PATENT DOCUMENTS

| JP | 10-198717 | 7/1998 |
| JP | 11-203105 | 7/1999 |
| JP | 2000-55986 | 2/2000 |
| JP | 2000-137741 | 5/2000 |

* cited by examiner

Primary Examiner—Christine T. Tu
(74) Attorney, Agent, or Firm—Staas & Halsey LLP

(57) ABSTRACT

The method of acquiring scan chain reorder information performs scan composition on the basis of a net list before the scan composition and acquires two or more pieces of information from a group consisting of an information which defines a start point and an end point of the scan chain, an information which defines an order of cells on the scan chain, and a unique name and a terminal name of each cell, an information which defines a clock domain and a polarity of a scan flip-flop on the scan chain, and an information which defines scan chain reorder enabling/disabling information.

10 Claims, 3 Drawing Sheets

METHOD OF ACQUIRING SCAN CHAIN REORDER INFORMATION, AND COMPUTER PRODUCT

FIELD OF THE INVENTION

The present invention relates to a method of acquiring scan chain reorder information.

BACKGROUND OF THE INVENTION

A scan design method is employed as a method for facilitating a test for a large-scaled LSI. When a scan composition is performed with a design of facilitating test ("DFT") tool on the basis of a net list before the scan composition, scan chain reorder information is generated as an interface to a location and wiring tool. The location and wiring tool performs a reordering of a scan chain on the basis of the scan chain reorder information.

In the conventional scan chain reorder information, however, information on a start point and an end point for a reordering with respect to the scan chain is not set. In addition, information on an order of cells on the scan chain, a unique name and a terminal name of each cell is not set. Further, information on a clock domain or a polarity of a scan flip-flop on the scan chain is not set. Furthermore, information which prohibits the reordering with respect to the cells in a software macro cell is not set either.

Therefore, when the reordering is performed on the basis of the conventional scan chain reorder information, since the information on the start point and the end point for the reordering does not exist, there is a problem that it is difficult to search a reorder object in the scan chain. Further, since the unique name of a cell on the scan chain is not known, there is a problem that a penetration of cell occurs due to an overlook of cell by a designer. Furthermore, since the information on the terminal name of a cell does not exist, there is a problem that, when a connection between a scan-in terminal (hereinafter, referred to as SI terminal) and a scan-out terminal (hereinafter, referred to as SO terminal) is erroneously conducted, it is impossible to determine the fact as an error.

Further, since the information on the clock domain and the polarity does not exist, the reordering is performed without considering the clock domain and the polarity, there is a problem that the penetration of data occurs or that a normal value cannot be latched. Further, since reorder prohibition information does not exist, there is a problem that, when the scan flip-flop is configured with a software macro cell structured of a combination of a selector and the scan flip-flop, the cells in the software macro cell are also reordered so that logic is changed.

SUMMARY OF THE INVENTION

It is an object of this invention to acquire the scan chain reorder information that can easily search for a reorder object in the scan chain, preventing the penetration of cell or an error of the functions of the scan-in (SI) and the scan-out (SO), preventing a problem that the penetration of data occurs or that the normal value cannot be latched, and further prohibiting the reordering of cells in the software macro cell thereby to perform appropriate scan chain reorder in the location and wiring processing.

The method according to the present invention acquires one or more of information from a group consisting of a start point and an end point of a scan chain, information which defines an order of cells on the scan chain, a unique name and a terminal name of each cell, information which defines a clock domain and a polarity of a scan flip-flop on the scan chain, and information which defines scan chain reorder enabling/disabling information as the scan chain reorder information.

According to the present invention, the start point and the endpoint of the scan chain are defined, which enables to grasp all the cells on the scan chain, thereby a processing can be conducted without changing the start point and the end point at the reordering. Further, the order of cells and the unique name and the terminal name of each cell are defined thereby the penetration of cells at the reordering can be prevented and the SI terminal and the SO terminal of the scan flip-flop can be connected without fail.

Further, when the clock domain and the polarity of the scan flip-flop are defined, the reordering is performed in consideration of the clock domain and the polarity even when a normal clock and a reverse clock coexist on the same scan chain, thereby a problem that the penetration of data occurs or that the normal value cannot be latched can be avoided. Further, when the scan chain reorder enabling/disabling information is defined, the reordering in the software macro cell is prohibited, thereby logic is prevented from changing.

Other objects and features of this invention will become apparent from the following description with reference to the accompanying drawings.

DETAILED DESCRIPTIONS

Embodiment of the method according to the present invention will be explained in detail with reference to the accompanying drawings.

Figure 1:
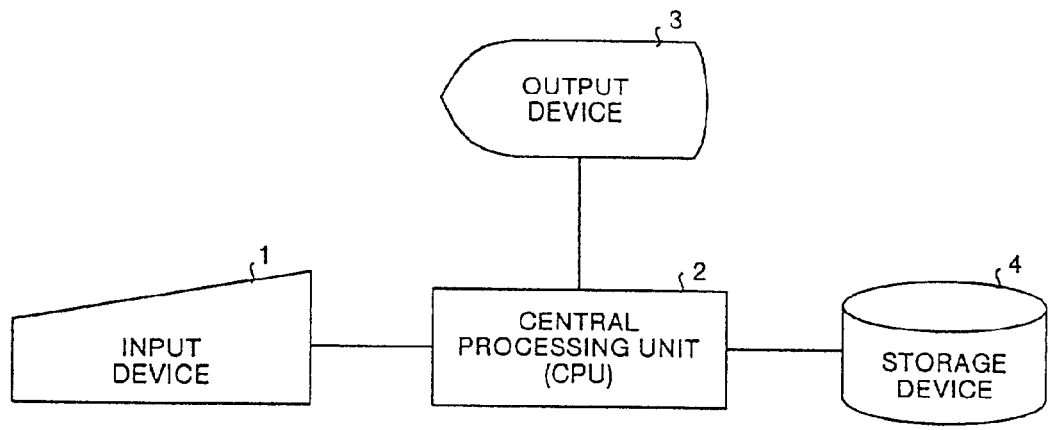
FIG. 1 is a diagram which shows an example of a computer system which carries out the present invention.

FIG. 1 shows an example of a computer system which carries out the present invention. This computer system comprises an input device 1, a central processing unit 2, an output device 3, and a storage device 4.

Figure 2:
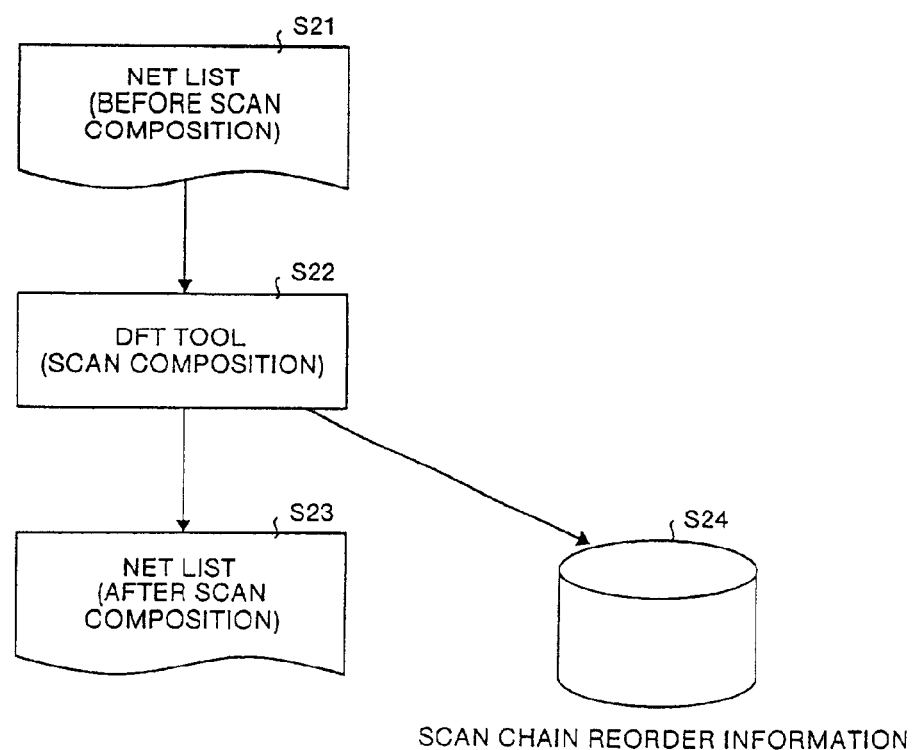
FIG. 2 is a diagram which shows a flow of a processing to acquire scan chain reorder information by carrying out the present invention.

FIG. 2 shows a flow of a processing for acquiring scan chain reorder information according to the present invention. A net list before a scan composition is obtained (step S21), the net list is supplied to a DFT tool and the scan composition is performed with the DFT tool (step S22). The resultant of scan composition, i.e. a net list after the scan composition is generated (step S23). Further, scan chain reorder information is generated as an interface to a location and wiring tool (step S24).

The scan chain reorder information generated here includes (1) information on a start point and an end point for a reordering with respect to a scan chain, (2) information on an order of cells on the scan chain, a unique name or a terminal name of each cell, (3) information on a clock domain or a polarity of a scan flip-flop on the scan chain, and (4) information which prohibits the reordering with respect to the cells in a software macro cell. The DFT tool can recognize the above (1) to (4) information, thereby scan chain reorder information including the (1) to (4) information is generated at the same time with the net list after the scan composition.

Figure 3:
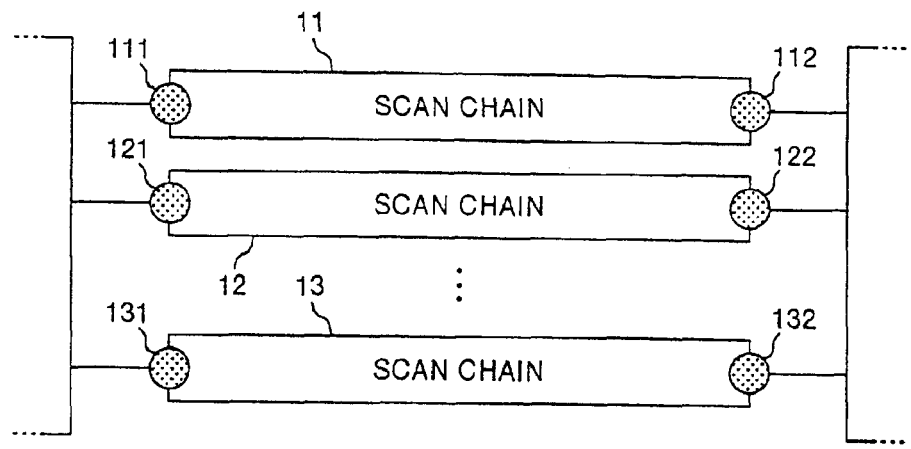
FIG. 3 is a diagram which explains a definition of a start point and an end point of a scan chain in the present invention.

FIG. 3 is a diagram which explains a definition of the start point and the end point of the scan chain. As shown in FIG. 3, with respect to each of the scan chains 11, 12, ..., 13, the respective start points 111, 121, ..., 131, and the respective end points 112, 122, ..., 132, are set.

Figure 4:
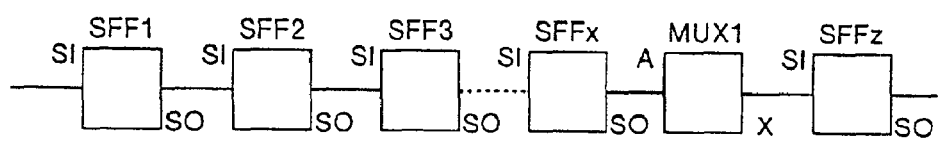
FIG. 4 is a diagram which explains a definition of an order of cells on the scan chain, a unique name and a terminal name of each cell in the present invention.

FIG. 4 is a diagram which explains a definition of the order of cells on the scan chain, and the unique name and the terminal name of each cell. In one scan chain, the order and the unique names and the terminal names of the cells are defined such that the first cell has the SI terminal and the SO terminal at a scan flip-flop SFF1, the second cell has the SI terminal and the SO terminal at a scan slip-slop SFF2, the subsequent is omitted, the x-th cell has the SI terminal and the SO terminal at a scan flip-flop SFFx, the x+1-th cell has an A terminal and an X terminal at a MUX1, and the last cell has the SI terminal and the SO terminal at a scan flip-flop SFFz. At that time, the cells other than at the scan flip-flop are similarly defined so that the order of connection is clarified, which facilitates to set reorder enabling/disabling information described later.

Figure 5:
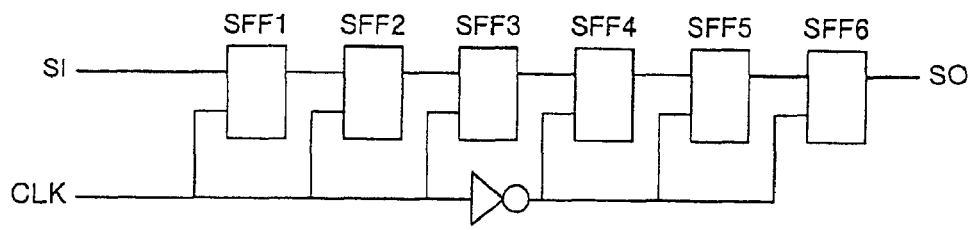
FIG. 5 is a diagram which explains a definition of a clock domain and a polarity of a scan flip-flop on the scan chain in the present invention.
Figure 6:
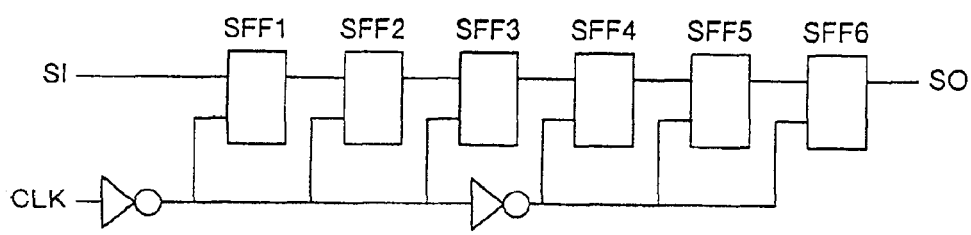
FIG. 6 is a diagram which explains a definition of the clock domain and the polarity of the scan flip-flop on the scan chain in the present invention.

FIGS. 5 and 6 are diagrams which explain a definition of the clock domain and the polarity of the scan flip-flop on the scan chain, respectively. Generally it is desirable that the reordering is performed in the same clock domain, however, it is possible to reorder over different clock domains by inserting an hold prevention circuit between different clock domains. Further, various ATPG tools for auto-generating a test pattern permit that a normal clock and a reverse clock coexist.

Therefore, for example, as shown in FIG. 5, the clock domain and the polarity are defined such that the clocks from the scan flip-flop SFF1 to the scan flip-flop SFF3 are the normal clocks and the clocks from the scan flip-flop SFF4 to the scan flip-flop SFF6 are the reverse clocks. Further, in an example shown in FIG. 6, the clocks from the scan flip-flop SFF1 to the scan flip-flop SFF3 are the reverse clocks, and the clocks from the scan flip-flop SFF4 to the scan flip-flop SFF6 are the normal clocks. In addition, both examples shown in FIGS. 5 and 6 are the examples of the same clock domain.

Figure 7:
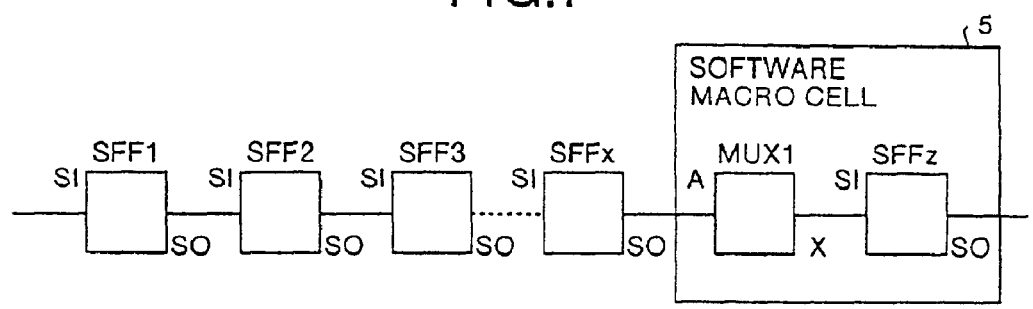
FIG. 7 is a diagram which explains a definition of scan chain reorder enabling/disabling information in the present invention.

FIG. 7 is a diagram which explains a definition of scan chain reorder enabling/disabling information. Reorder disabling information is set with respect to a software macro cell 5 comprising, for example, the MUX1 and the scan flip-flop SFFz in order that logic is not changed by the reordering. Further, also when the DFT tool inserts the hold prevention circuit into a data input into the different clock domain, the reorder disabling information is set similarly to when the software macro cell 5.

Figure 8:
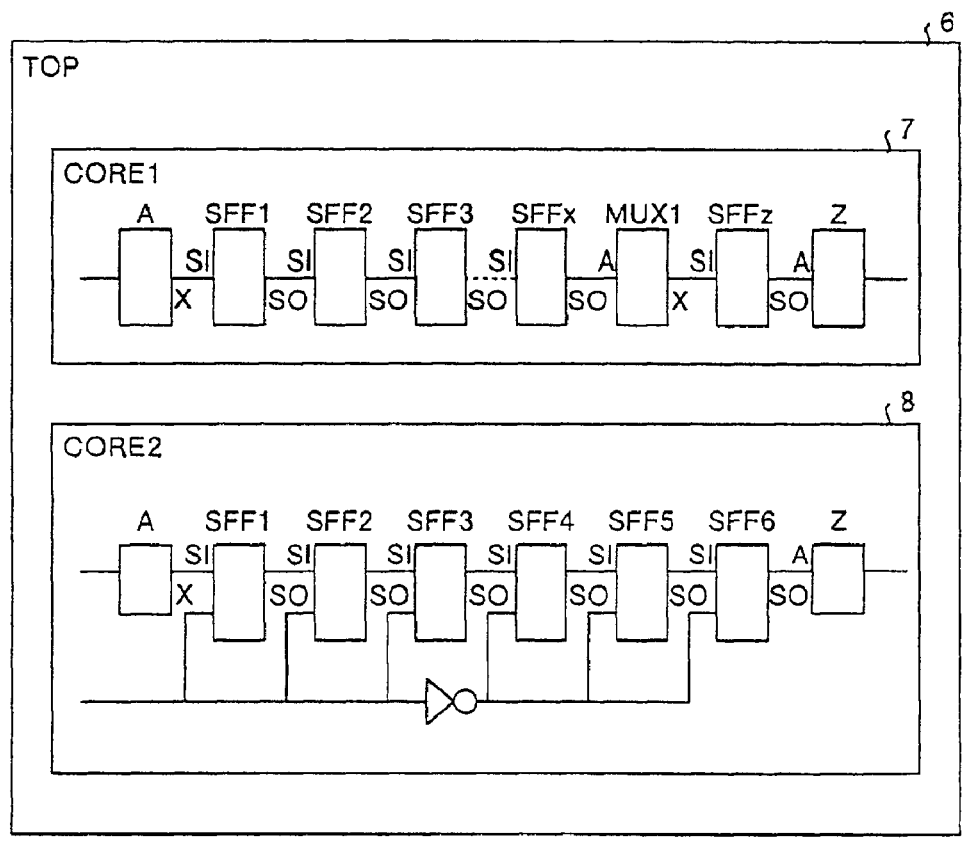
FIG. 8 is a diagram which shows a circuit example which explains scan chain reorder information obtained by carrying out the present invention.

FIG. 8 is a diagram which shows a circuit example which explains a specific sample of scan chain reorder information. In an example shown in FIG. 8, a first CORE (CORE1) 7 and a second CORE (CORE2) 8 are at a TOP6. The first CORE 7 is arranged in the order of the A having the X terminal, the scan flip-flop SFF1 having the SI terminal and the SO terminal, the scan flip-flop SFF2 having the SI terminal and the SO terminal, the scan flip-flop SFF3 having the SI terminal and the SO terminal and so on, the scan flip-flop SFFx having the SI terminal and the SO terminal, the MUX1 having the A terminal and the X terminal, the scan flip-flop SFFz having the SI terminal and the SO terminal, and the Z having the A terminal. The MUX1 and the scan flip-flop SFFz are the software macro cells. Further, each scan flip-flop is operated with a clock CK1.

The second CORE 8 is arranged in the order of the A having the X terminal, the scan flip-flop SFF1 having the SI terminal and the SO terminal, the scan flip-flop SFF2 having the SI terminal and the SO terminal, the scan flip-flop SFF3 having the SI terminal and the SO terminal, the scan flip-flop SFF4 having the SI terminal and the SO terminal, the scan flip-flop SFF5 having the SI terminal and the SO terminal, the scan flip-flop SFF6 having the SI terminal and the SO terminal, and the Z having the A terminal. Each scan flip-flop is operated with a clock CK2 having a domain different from the clock CK1 of the first CORE7, however, the clocks from the scan flip-flop SFF1 to the scan flip-flop SFF3 are the normal clocks and the clocks from scan flip-flop SFF4 to the scan flip-flop SFF6 are the reverse clocks.

In the circuit example shown in FIG. 8, the contents of a file for interfacing to the location and wiring tool are as follows, for example.

```
; Chain1
    ; First: TOP/CORE1/A X
        TOP/CORE1/SFF1 SI SO CK1
        TOP/CORE1/SFF2 SI SO CK1
        TOP/CORE1/SFF3 SI SO CK1
        ...
        TOP/CORE1/SFFx SI SO CK1
        ; NotOrder
        TOP/CORE1/MUX1 A X
        TOP/CORE1/SFFz SI SO CK1
        ; EndNotOrder
    ; Last: TOP/CORE1/Z A
; End Chain1
; Chain2
    ; First: TOP/CORE2/A X
        TOP/CORE2/SFF1 SI SO CK2
        TOP/CORE2/SFF2 SI SO CK2
        TOP/CORE2/SFF3 SI SO CK2
        TOP/CORE2/SFF4 SI SO XCK2
        TOP/CORE2/SFF5 SI SO XCK2
        TOP/CORE2/SFF6 SI SO XCK2
    ; Last: TOP/CORE2/Z A
; End Chain2
```

In the above contents of the file, "; Chain<n>" to "; End Chain<n>" define one scan chain. "; First cell name/terminal name" defines the start point of the scan chain. "; Last cell name/terminal name" defines the end point of the scan chain. Then, the cells on the scan chain are orderly described in "; First" to "; Last". With respect to each cell, "cell name/scan input terminal name/scan output terminal name/clock name" is defined. When the clock is a negative clock (reverse clock), "x" is added to the clock name. Further, the cells which are not to be reordered are described in "; NotOrder"

to "; EndNotOrder" according to the above definition of the cells. The cells described in "; NotOrder" to "; EndNotOrder" can be reordered similarly to the cells in "; First" to "; Last".

According to this embodiment, the start point and the end point of the scan chain are defined so that all the cells on the scan chain can be grasped, thereby a processing can be conducted without changing the start point and the end point of the scan chain at the reordering later. Moreover, the order and the unique names of the cells are defined so that the penetration of cells at the reordering can be prevented. Furthermore, the terminal names of the cells are defined so that the SI terminal and the SO terminal of the scan flip-flop can be connected without fail.

Further, the clock domain and the polarity are defined so that, even when the normal clock and the reverse clock coexist on the same scan chain, the reordering is performed in consideration of the clock domain and the polarity, thereby it is possible to avoid a problem that the penetration of data occurs or that the normal value cannot be latched. Further, the reorder enabling/disabling information is defined so that the reordering in the software macro cell can be prohibited, thereby logic can be prevented from changing. Therefore, more appropriate scan chain reordering can be performed in the location and wiring processing.

The above mentioned embodiment can be variously modified. For example, a description of the file to interface to the location and wiring tool is not limited to the aforementioned example.

Further the scan chain reorder information acquiring method of this embodiment may be a program readable by a preliminarily prepared computer and this method is achieved by executing that program with a personal computer or work station. This program is recorded in a computer-readable recording medium such as a hard disc (HD), a floppy disc (FD), CD-ROM, MO, DVD and executed by reading from those recording media by means of the computer. Further, this program may be a transmission medium which can be distributed via network such as the Internet.

As explained above, according to the present invention, it is possible to grasp all the cells on the scan chain and process the cells without changing the start point and the end point at the reordering. Further, the penetration of cells at the reordering can be prevented, and the SI terminal and the SO terminal of the scan flip-flop can be connected without fail. Further, even when the normal clock and the reverse clock coexist in the same scan chain, the reordering is performed in consideration of the clock domain and the polarity, thereby it is possible to avoid a problem that the penetration of data occurs or that the normal value cannot be latched. Further, since the reordering in the software macro cell can be prohibited, logic can be prevented from changing. Therefore, more appropriate scan chain reordering can be performed in the location and wiring processing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of acquiring scan chain reorder information, comprising performing scan composition on the basis of a net list before the scan composition and acquiring information which defines a start point and an end point of a scan chain.

2. A method of acquiring scan chain reorder information, comprising performing scan composition on the basis of a net list before the scan composition and acquiring information which defines an order of cells on the scan chain, and a unique name and a terminal name of each cell.

3. A method of acquiring scan chain reorder information, comprising performing scan composition on the basis of a net list before the scan composition and acquiring information which defines a clock domain and a polarity of a scan flip-flop on the scan chain.

4. A method of acquiring scan chain reorder information, comprising performing scan composition on the basis of a net list before the scan composition and acquiring information which defines scan chain reorder enabling/disabling information.

5. A method of acquiring scan chain reorder information, comprising performing scan composition on the basis of a net list before the scan composition and acquiring two or more pieces of information from a group consisting of an information which defines a start point and an end point of the scan chain, an information which defines an order of cells on the scan chain, and a unique name and a terminal name of each cell, an information which defines a clock domain and a polarity of a scan flip-flop on the scan chain, and an information which defines scan chain reorder enabling/disabling information.

6. A computer program for acquiring scan chain reorder information, comprising performing scan composition on the basis of a net list before the scan composition and acquiring information which defines a start point and an end point of a scan chain.

7. A computer program for acquiring scan chain reorder information, comprising performing scan composition on the basis of a net list before the scan composition and acquiring information which defines an order of cells on the scan chain, and a unique name and a terminal name of each cell.

8. A computer program for acquiring scan chain reorder information, comprising performing scan composition on the basis of a net list before the scan composition and acquiring information which defines a clock domain and a polarity of a scan flip-flop on the scan chain.

9. A computer program for acquiring scan chain reorder information, comprising performing scan composition on the basis of a net list before the scan composition and acquiring information which defines scan chain reorder enabling/disabling information.

10. A computer program for acquiring scan chain reorder information, comprising performing scan composition on the basis of a net list before the scan composition and acquiring two or more pieces of information from a group consisting of an information which defines a start point and an end point of the scan chain, an information which defines an order of cells on the scan chain, and a unique name and a terminal name of each cell, an information which defines a clock domain and a polarity of a scan flip-flop on the scan chain, and an information which defines scan chain reorder enabling/disabling information.

* * * * *